United States Patent
Chen et al.

(10) Patent No.: US 12,027,852 B2
(45) Date of Patent: Jul. 2, 2024

(54) DEEP LEARNING-BASED OPTIMAL POWER FLOW SOLUTION WITH APPLICATIONS TO OPERATING ELECTRICAL POWER SYSTEMS

(71) Applicant: City University of Hong Kong, Hong Kong (CN)

(72) Inventors: Minghua Chen, Hong Kong (CN); Wanjun Huang, Hong Kong (CN); Xiang Pan, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 393 days.

(21) Appl. No.: 17/448,537

(22) Filed: Sep. 23, 2021

(65) Prior Publication Data

US 2023/0085739 A1 Mar. 23, 2023

(51) Int. Cl.
*H02J 13/00* (2006.01)
*G01R 19/00* (2006.01)
(Continued)

(52) U.S. Cl.
CPC .... *H02J 13/00002* (2020.01); *G01R 19/0084* (2013.01); *G01R 25/00* (2013.01);
(Continued)

(58) Field of Classification Search
CPC .... H02J 13/00002; H02J 3/16; H02J 2203/20; G06N 3/045; G01R 19/0084; G01R 25/00
See application file for complete search history.

(56) References Cited

U.S. PATENT DOCUMENTS 10,296,988 B2 * 5/2019 Mitra ............... G06Q 50/06
2006/0229767 A1 * 10/2006 Chu ................. H02J 3/1871
700/286
(Continued)

FOREIGN PATENT DOCUMENTS

CN 111798037 A 10/2020

OTHER PUBLICATIONS

Baker, "Emulating AC OPF solvers for Obtaining Sub-second Feasible, Near-Optimal Solutions", Cornell University, arXiv, 2020 (Year: 2020).*

(Continued)

*Primary Examiner* — Paul D Lee
(74) *Attorney, Agent, or Firm* — S&F/WEHRW (57) ABSTRACT

DeepOPF-V, a deep neural network (DNN)-based voltage-constrained approach for solving an alternating-current optimal power flow (AC-OPF) problem, is used to determine an operating point of an AC electrical power system. Deep-OPE-V advantageously uses two DNNs to separately determine voltage magnitudes and voltage phase angles of buses in the system without cross-over operations between the two DNNs. A computation complexity is reduced when compared to using a single DNN for generating both the magnitudes and phase angles, allowing high computation efficiency achieved by DeepOPE-V. Remaining variables of the system are computed based on the determined magnitudes and phase angles. A solution for the operating condition is predicted. A fast post-processing (PP) method is developed to improve the feasibility of the predicted solution. The PP method uses linear adjustment to adjust the predicted solution to improve the solution feasibility while enabling fast execution of the PP method.

8 Claims, 2 Drawing Sheets

(51) Int. Cl.
    *G01R 25/00*     (2006.01)
    *G06N 3/045*     (2023.01)
    *H02J 3/16*     (2006.01)

(52) U.S. Cl.
    CPC ............... *G06N 3/045* (2023.01); *H02J 3/16* (2013.01); *H02J 2203/20* (2020.01)

(56) References Cited

U.S. PATENT DOCUMENTS

| | | | | |
|---|---|---|---|---|
| 2017/0184640 | A1* | 6/2017 | Pileggi | H02J 3/06 |
| 2017/0244250 | A1* | 8/2017 | Sun | H02J 3/18 |
| 2020/0091767 | A1* | 3/2020 | Khodaei | G01R 19/0038 |
| 2021/0367424 | A1* | 11/2021 | Diao | G05B 13/027 |

OTHER PUBLICATIONS

Fioretto et al., "Predicting AC Optimal Power Flows: Combining Deep Learning and Lagrangian Dual Methods", Proceedings of the AAAI Conference on Artificial Intelligence —Apr. 2020 (Year: 2020).*
Owerko et al., "Optimal Power Flow Using Graph Neural Networks", Cornell University, arXiv, 2019 (Year: 2019).*
Pan et al., "DeepOPF: A Feasibility-Optimized Deep Neural Network Approach for AC Optimal Power Flow Problems", Cornell University, arXiv, 2020 (Year: 2020).*
Pan et al., "DeepOPF: A Deep Neural Network Approach for Security-Constrained DC Optimal Power Flow", Cornell University, arXiv, 2020 (Year: 2020).*
Owerko et. al., Optimal Power Flow Using Graph Neural Networks, IEEE International Conference on Acoustics, Speech and Signal Processing (ICASSP). IEEE, 2020: 5930-5934.
Fioretto et. al., Predicting AC Optimal Power Flows: Combining Deep Learning and Lagrangian Dual Methods, Proceedings of the AAAI Conference on Artificial Intelligence. 2020, 34(01): 630-637.
Neel et. al., Machine Learning for AC Optimal Power Flow, In Proceedings of the 36th International Conference on Machine Learning Workshop, Long Beach, CA, USA, Jun. 10-15, 2019.
W. Dong, Z. Xie, G. Kestor and D. Li, "Smart-PGsim: using neural network to accelerate AC-OPF power grid simulation," arXiv preprint, arXiv:2008.11827, 2020.
Y. Chen and B. Zhang, "Learning to solve network flow problems via neural decoding," arXiv preprint arXiv:2002.04091, 2020.
F. Hasan, A. Kargarian and J. Mohammadi, "Hybrid learning aided inactive constraints filtering algorithm to enhance AC Opf solution time," Trans. Ind. Applicat., 2021.
X. Pan, T. Zhao and M. Chen, "DeepOPF: Deep neural network for DC optimal power flow," in IEEE SmartGridComm, 2019.
X. Pan, T. Zhao, M. Chen and S. Zhang, "DeepOPF: A deep neural network approach for security-constrained DC optimal power flow," IEEE Trans. Power Syst., 2020.
X. Pan, M. Chen, T. Zhao and S. H. Low, "DeepOPF: A feasibility optimized deep neural network approach for AC optimal power flow problems," arXiv preprint arXiv:2007.01002, 2020.
A. S. Zamzam and K. Baker, "Learning optimal solutions for extremely fast AC optimal power flow," in IEEE SmartGridComm, 2020.
K. Baker, "Emulating AC OPF solvers for obtaining sub-second feasible, near-optimal solutions," arXiv preprint arXiv:2012.10031, 2020.
M. Chatzos, F. Fioretto, T. W. Mak and P. Van Hentenryck, "High-fidelity machine learning approximations of large-scale optimal power flow," arXiv preprint arXiv:2006.16356, 2020.
S. Frank and S. Rebennack (2016), "An introduction to optimal power flow: Theory, formulation, and examples," IIE Transactions, 48:12, 1172-1197, DOI:10.1080/0740817X.2016.1189626.

* cited by examiner

DEEP LEARNING-BASED OPTIMAL POWER FLOW SOLUTION WITH APPLICATIONS TO OPERATING ELECTRICAL POWER SYSTEMS

ABBREVIATIONS

AC Alternating current
CPU Central processing unit
DC Direct current
DNN Deep neural network
GPU Graphics processing unit
MIPS Matpower Interior Point Solver
MVA Mega volt ampere
OPF Optimal power flow
PP Post-processing
p.u. per unit
RHS Right-hand side
VAP Voltage angle predictor
VMP Voltage magnitude predictor

TECHNICAL FIELD

The present disclosure generally relates to determining an operating condition of an AC electrical power system by solving an AC-OPF problem that models the AC electrical power system. In particular, the present disclosure relates to using DNNs to speed up computing a solution to the AC-OPF problem and applying the solution to operating the AC electrical power system.

BACKGROUND

The AC-OPF problem is an optimization problem concerned with finding a steady-state operational point that minimizes a generation cost, a loss, an amount of emission, etc. in an AC electrical power system. The AC-OPF problem is a fundamental yet challenging problem in power systems. With increasing uncertainties brought by intermittent renewables and highly stochastic loads, the AC-OPF problem needs to be solved more frequently to maintain stable and economic system operation. Thus, it is of great significance to find feasible solutions for AC-OPF with high computational efficiency, especially for large-scale systems.

Leveraging the powerful learning ability of DNNs, various DNN-based approaches have been proposed to solve the AC-OPF problem more efficiently, which can be classified into two main categories: hybrid approach and standalone approach. The hybrid approach aims to speed up conventional physics-based solvers (e.g., MIPS) by providing warm-start points to accelerate convergence [1] or predicting active constraints [2] or inactive constraints [3] to reduce the problem size. Since it still needs to solve the original or truncated OPF problem iteratively, all operational constraints are considered, but the speedup is limited. The speedup is less than one order of magnitude in most studies.

The standalone approach predicts the solution of AC-OPF directly without solving the optimization problem. Hence, it has a much greater speedup than the hybrid approach. Following the predict-and-reconstruct framework and the handy technique of ensuring box constraints for DC-OPF [4], [5], several DNN-based approaches were developed for AC-OPF [6]-[8]. One strategy is to learn the mapping between loads and generation set points [6], [7]. Another strategy is to train DNNs to emulate an iterative solver [8]. Both strategies need to solve power flow to obtain the remaining variables, which limits the speedup considerably.

The main concern of the standalone approach is the feasibility of the solution, such as the need to satisfy voltage constraints which are critical for system stability. To address this issue, one might penalize constraint violations in the loss function to help enforce the constraints [5], [6]. Different from the above strategies, [9] combines DNNs and Lagrangian duality to predict all variables. Although a greater speedup in computation was reported, the basic power flow balance constraints and demanded loads may not be satisfied.

There is a need in the art for a technique to obtain a solution to the AC-OPF problem with a large speedup in computation while satisfying the constraints.

SUMMARY

Mathematical equations referenced in this Summary can be found in Detailed Description.

An aspect of the present disclosure provides a computer-implemented method for determining an operating condition of an AC electrical power system. The system is modeled with a plurality of transmission lines interconnecting a plurality of buses. The system is subject to a plurality of equality constraints corresponding to power flow balance equations in operating the system and subject to a plurality of inequality constraints corresponding to operation limits of the plurality of buses and the plurality of transmission lines. The plurality of buses is assigned with a plurality of active loads and a plurality of reactive loads such that an individual bus is arranged to satisfy a respective active load and a respective reactive load.

In the method, a plurality of voltage magnitudes and a plurality of voltage phase angles of the plurality of buses are determined such that a complex-valued voltage observed at the individual bus is predicted. Advantageously, the plurality of voltage magnitudes and the plurality of voltage phase angles are separately computed by a first DNN and a second DNN, respectively, without any cross-over operation between the first and second DNNs. It thereby reduces the computation complexity of the first and second DNNs in comparison to using a single DNN to compute both the plurality of voltage magnitudes and the plurality of voltage phase angles. In each of the first and second DNNs, the plurality of active loads and the plurality of reactive loads are received as inputs.

Afterwards, a required active generation and a required reactive generation for the individual bus are computed according to the plurality of equality constraints, the plurality of voltage magnitudes and the plurality of voltage phase angles. As a result, a plurality of required active generations and a plurality of required reactive generations for the plurality of buses are obtained.

Apart from the required active generation and the required reactive generation, optionally a satisfied active load and a satisfied reactive load for the individual bus are also computed according to the plurality of equality constraints, the plurality of voltage magnitudes and the plurality of voltage phase angles. As a result, a plurality of satisfied active load and a plurality of satisfied reactive load for the plurality of buses are obtained.

If the plurality of inequality constraints is satisfied by the plurality of required active generations and the plurality of required reactive generations, the plurality of required active generations and the plurality of required reactive generations are used as the determined operating condition.

If the plurality of inequality constraints is not satisfied by the plurality of required active generations and the plurality of required reactive generations, an adjusted plurality of required active generations and an adjusted plurality of required reactive generations are used as the determined operating condition.

Preferably, the adjusted plurality of required active generations and the adjusted plurality of required reactive generations are obtained from executing a PP process. In the PP process, the plurality of voltage magnitudes and the plurality of voltage phase angles are adjusted by linear adjustment according to (10) and (11) to form an adjusted plurality of voltage magnitudes and an adjusted plurality of voltage phase angles. Thereafter, the adjusted plurality of required active generations and the adjusted plurality of required reactive generations are computed from the adjusted plurality of voltage magnitudes and the adjusted plurality of voltage phase angles according to the plurality of equality constraints. A computation burden in executing the PP process may be reduced by using an approximation given by (12) in (11).

In certain embodiments, the first and second DNNs are trained with training data before using the first and second DNNs to compute the plurality of voltage magnitudes and the plurality of voltage phase angles.

In certain embodiments, a plurality of AC-OPF solutions for a plurality of reference AC electrical power systems is obtained. The plurality of AC-OPF solutions is incorporated into the training data.

In certain embodiments, an individual AC-OPF solution for a respective reference AC electrical power system is generated by using an OPF solver to solve an AC-OPF problem formulated for the respective reference AC electrical power system. The OPF solver may be MIPS.

Other aspects of the present disclosure are disclosed as illustrated by the embodiments hereinafter.

Skilled artisans will appreciate that elements in the figures are illustrated for simplicity and clarity and have not necessarily been depicted to scale.

DETAILED DESCRIPTION

As used herein, "deep neural network" means an artificial neural network with more than two layers.

As used herein, "active generation" means real power generated, supplied, or required to be supplied, by a certain electrical power source. "Active generation" is synonymous with generator real power injection [1], real power generation [3], active power generation [6], [9], active power injection from generator [7], real power output at a generator [8] and generator real power [10] as used in the technical field of AC-OPF.

As used herein, "reactive generation" means reactive power developed, or supplied, by a certain electrical power source. "Reactive generation" is synonymous with generator reactive power injection [1], reactive power generation [3], reactive power generation [6], [9], reactive power injection from generator [7], reactive power output at the generator [8] and generator reactive power [10] as used in the technical field of AC-OPF.

As used herein, "active load" means real power absorbed or demanded by a certain load. "Active load" is synonymous with real power demand [3], active power load [6], [9] and load real power [10] as used in the technical field of AC-OPF.

As used herein, "reactive load" means reactive power experienced or demanded by a certain load. "Reactive load" is synonymous with reactive power demand [3], reactive power load [6], [9] and load reactive power [10] as used in the technical field of AC-OPF.

The present disclosure discloses DeepOPF-V as a DNN-based voltage-constrained approach to solve an AC-OPF problem with high efficiency. DeepOPF-V is applicable to operating an AC electrical power system. A computer-implemented method for determining an operating condition of the AC electrical power system according to DeepOPF-V is also disclosed.

A. AC-OPF Problem

In defining the AC-OPF problem for finding an optimal operating condition of the AC electrical power system, an undirected graph is used to model the system. The system is modeled as a network of electrical buses (nodes in the undirected graph) interconnected by transmission lines (branches or arcs in the undirected graph), where a certain transmission line that interconnects two buses is modeled to have an equivalent impedance or admittance that represents an aggregated effect due to cables, transformers, inductors, capacitors, etc., located between the two buses. The electrical buses include generation buses and load buses. The purpose of the system is to transfer electrical power from the generation buses (supply) to the load buses (demand). The AC-OPF problem is to determine an optimal setting of the generation buses in supplying electrical power to satisfy the demand in the sense of minimizing the total cost of electricity generation while maintaining the system to be operated within certain operation limits.

Formulation of the AC-OPF problem can be found in various references in the art, e.g., [10]. The AC-OPF problem for the AC electrical power system can be formulated as $$\min \sum_{i \in \mathcal{N}_G} C_i(P_{gi}) \qquad (1)$$

$$\text{s.t. } P_{gi} - P_{di} = \sum_{j \in \mathcal{N}} V_i V_j (g_{ij} \cos\theta_{ij} + b_{ij} \sin\theta_{ij}), i \in \mathcal{N}, \qquad (2)$$

$$Q_{gi} - Q_{di} = \sum_{j \in \mathcal{N}} V_i V_j (g_{ij} \sin\theta_{ij} - b_{ij} \cos\theta_{ij}), i \in \mathcal{N}, \qquad (3)$$

$$P_{gi}^{min} \leq P_{gi} \leq P_{gi}^{max}, i \in \mathcal{N}_G, \qquad (4)$$

$$Q_{gi}^{min} \leq Q_{gi} \leq Q_{gi}^{max}, i \in \mathcal{N}_G, \qquad (5)$$

$$V_i^{min} \leq V_i \leq V_i^{max}, i \in \mathcal{N}, \qquad (6)$$

$$P_{ij}^2 + Q_{ij}^2 \leq (S_{ij}^{max})^2, (i,j) \in \varepsilon, \qquad (7)$$

$$\theta_{ij}^{min} \leq \theta_{ij} \leq \theta_{ij}^{max}, (i,j) \in \varepsilon, \qquad (8)$$

where: $\mathcal{N}$, $\mathcal{N}_G$ and $\varepsilon$ denote a plurality of buses, a plurality of generation buses and a plurality of transmission lines, respectively, in the AC electrical power system; $g_{ij}$ and $b_{ij}$ are a conductance and a susceptance, respectively, of branch (i,j), i.e. a transmission line linking bus i and bus j; $P_{gi}$ and $Q_{gi}$ denote an active generation and a reactive generation, respectively, injected to bus i (by one or more power sources connected to bus i); $P_{di}$ and $Q_{di}$ denote an active load and a reactive load, respectively, receiving active/reactive power from bus i; $V_i$ and $\theta_i$ are a voltage magnitude and a voltage phase angle, respectively, at bus i; $P_{ij}$ and $Q_{ij}$ denote an active power and a reactive power, respectively, flowing from bus i to bus j through branch (i,j); $\theta_{ij}$ is given by $\theta_{ij}=\theta_i-\theta_j$; upper and lower bounds of a certain variable x are represented by $x^{max}$ and $x^{min}$, respectively; a branch flow limit of branch (i,j) is denoted as $S_{ij}^{max}$, the branch flow limit being an operation limit in operating the system; $C_i(P_{gi})$ is an operating cost of generation bus i in generating active power $P_{gi}$; and $\sum_{i\in\mathcal{N}_G} C_i(P_{gi})$ is the total generation cost, which is the objective function of the AC-OPF problem.

Note that the plurality of buses is assigned with a plurality of active loads and a plurality of reactive loads such that bus i is arranged to satisfy the active load $P_{di}$ and the reactive load $Q_{di}$. The AC-OPF problem aims to minimize the total generation cost in (1) with all constraints satisfied and satisfying the plurality of active loads and the plurality of reactive loads. The Kirchhoff's circuit laws are ensured by (2)-(3). Equations (2) and (3) form a plurality of equality constraints corresponding to power flow balance equations in operating the system. Active and reactive power generation limits are enforced by (4)-(5); voltage magnitude limit is ensured by (6); branch flows and voltage phase angles are restricted by (7) and (8), respectively. Equations (4)-(8) form a plurality of inequality constraints corresponding to operation limits of the plurality of buses and the plurality of transmission lines.

B. DeepOPF-V

Denote |X| as the total number of members in a set X, and denote $Y^T$ as a transpose of a matrix Y. For convenience, let $P_d=[P_{d1}, \ldots, P_{d|\mathcal{N}|}]^T$ be the plurality of active loads in vector form, $Q_d=[Q_{d1}, \ldots, Q_{d|\mathcal{N}|}]^T$ be the plurality of reactive loads in vector form, $P_g=[P_{g1}, \ldots, P_{g|\mathcal{N}|}]^T$ be a plurality of active generations in vector form, $Q_g=[Q_{g1}, \ldots, Q_{g|\mathcal{N}|}]^T$ be a plurality of reactive generations in vector form, $V=[V_1, \ldots, V_{|\mathcal{N}|}]^T$ be a plurality of voltage magnitudes of the plurality of buses in vector form, $\theta=[\theta_1, \ldots, \theta_{|\mathcal{N}|}]^T$ be a plurality of voltage phase angles of the plurality of buses in vector form, $\hat{V}=[\hat{V}_1, \ldots, \hat{V}_{|\mathcal{N}|}]^T$ be a predicted V, and $\hat{\theta}=[\hat{\theta}_1, \ldots, \hat{\theta}_{|\mathcal{N}|}]^T$ be a predicted $\theta$.

B.1. Disclosed DNN-Based Voltage-Constrained Approach

Figure 1:
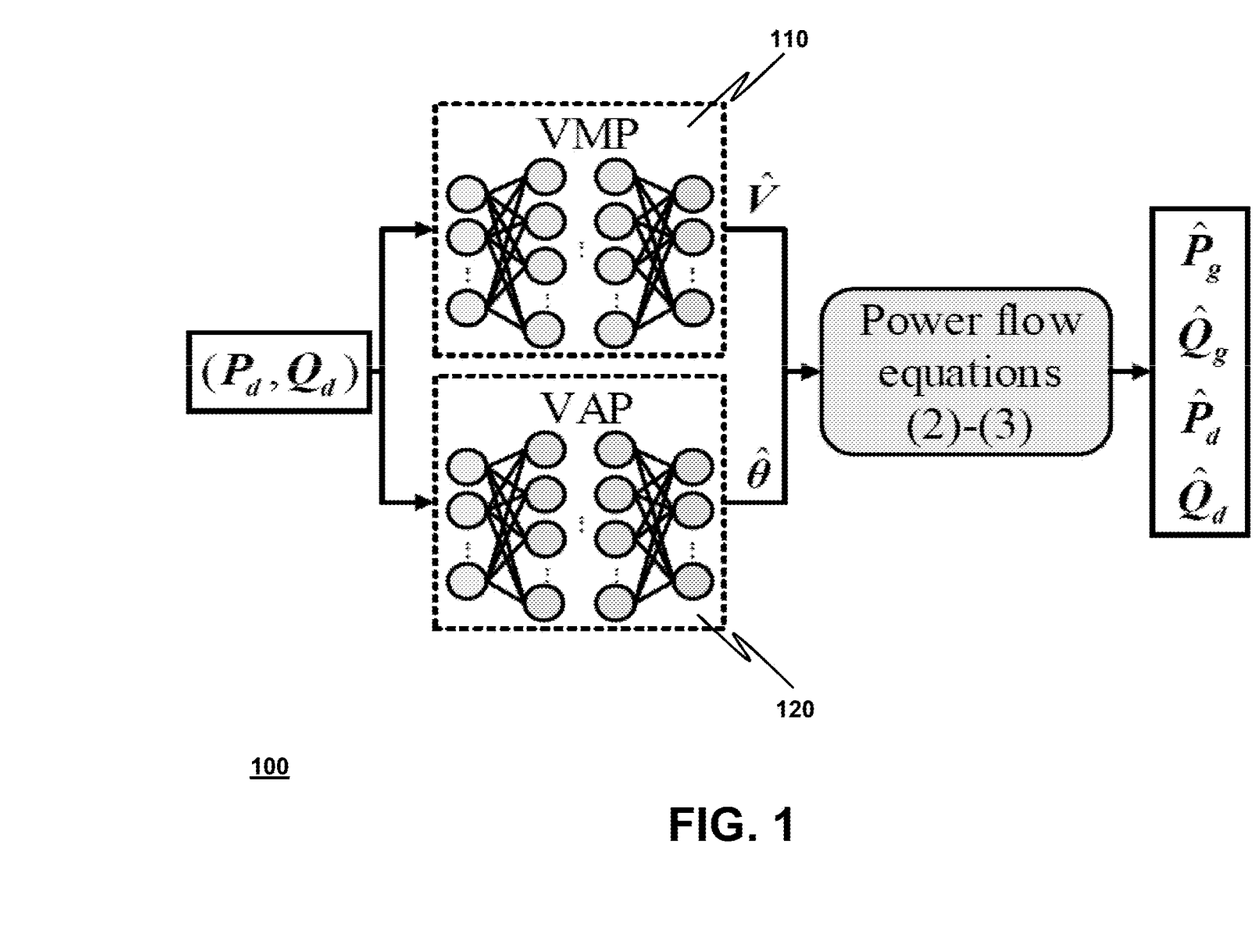
FIG. 1 depicts a schematic diagram of DeepOPF-V as disclosed herein.

FIG. 1 depicts a schematic diagram of the disclosed DeepOPF-V 100. DNNs 110, 120 are employed to learn the mapping between loads ($P_d,Q_d$) and voltages of all buses instead of only the generation buses or all the variables as in previous works. After training, for each input ($P_d,Q_d$), the voltages are predicted by the well-trained DNNs 110, 120 instantly. Then, using the predicted voltage magnitudes $\hat{V}$, voltage angles $\hat{\theta}$ and the given load input ($P_d,Q_d$), one can easily compute the RHS of the equations in (2)-(3). The remaining solution variables $\hat{P}_g$, $\hat{Q}_g$ and some auxiliary variables ($\hat{P}_d,\hat{Q}_d$) are then directly calculated using the obtained RHS values without a need to solve non-linear power flow equations.

Here, $\hat{P}_g=[\hat{P}_{g1}, \ldots, \hat{P}_{g|\mathcal{N}|}]^T$ is a plurality of required active generations in vector form where $\hat{P}_{gi}$, $i\in\mathcal{N}$, is an (estimated) active generation required to be generated at bus i; and $\hat{Q}_g=[\hat{Q}_{g1}, \ldots, \hat{Q}_{g|\mathcal{N}|}]^T$ is a plurality of required reactive generations in vector form where $\hat{Q}_{gi}$, $i\in\mathcal{N}$, is an (estimated) reactive generation that is required to be generated at bus i. In addition, $\hat{P}_d=[\hat{P}_{d1}, \ldots, \hat{P}_{d|\mathcal{N}|}]^T$ is a plurality of satisfied active loads in vector form where $\hat{P}_{di}$, $i\in\mathcal{N}$, is an (estimated) active load that receives active power from bus i that is satisfied under the generations $\hat{P}_g$ and $\hat{Q}_g$; and $\hat{Q}_d=[\hat{Q}_{d1}, \ldots, \hat{Q}_{d|\mathcal{N}|}]^T$ is a plurality of satisfied reactive loads in vector form where $\hat{Q}_{di}$, $i\in\mathcal{N}$, is an (estimated) reactive load that receives reactive power from bus i that is satisfied under the generations $\hat{P}_g$ and $\hat{Q}_g$.

Specifically, $\hat{P}_{gi}$, $\hat{Q}_{gi}$, $\hat{P}_{di}$ and $\hat{Q}_{di}$ for bus i are obtained as follows. If there are only generators or loads, its required active/reactive generation (i.e. $\hat{P}_{gi}/\hat{Q}_{gi}$) or satisfied active/reactive load (i.e. $\hat{P}_{di}/\hat{Q}_{di}$) is obtained directly. If there are both generators and loads, $\hat{P}_{di}$ and $\hat{Q}_{di}$ are set to the given loads $\hat{P}_{di}$ and $\hat{Q}_{di}$, respectively, and then $\hat{P}_{gi}$ and $\hat{Q}_{gi}$ are directly calculated from (2)-(3). After obtaining $\hat{P}_g$, the objective function is calculated by (1). Due to the voltage prediction errors, there could be unsatisfied loads, i.e. mismatches between ($P_d,Q_d$) and ($\hat{P}_d,\hat{Q}_d$). Occurrence of the unsatisfied loads will be discussed later.

Note that the first and second DNNs 110, 120, which are two separate, disjoint DNNs, are used to compute $\hat{V}$ and $\hat{\theta}$, and respectively. Any cross-over operation between the first and second DNNs 110, 120 is eliminated. As used herein, "a cross-over operation" between the first and second DNNs 110, 120 is an operation that a computation result obtained in the first DNN 110 is passed to the second DNN 120 for further computation, or vice versa. By eliminating any cross-over operation, the size of each of the first and second DNNs 110, 120 is reduced when compared to using a single DNN to compute both $\hat{V}$ and $\hat{\theta}$. In addition, the first and second DNNs 110, 120 may be executed in parallel for further reducing the total computation time. As a result, a first speedup achieved by using DeepOPF-V 100 over a conventional physics-based solver is most often greater than a second speedup achieved by using a DNN-based AC-OPF solver that employs a single DNN. The use of two separate DNNs for computing $\hat{V}$ and $\hat{\theta}$ in DeepOPF-V 100 contrasts the use of a single DNN in earlier DNN-based AC-OPF solvers [1]-[9]. Also distinct from previous studies that learn the mapping between loads and generations or all solution variables, DeepOPF-V 100 learns the mapping between loads and voltages of all buses and directly reconstructs the remaining solution variables via simple scalar calculation, which guarantees the plurality of (power flow) equality constraints and is expected to achieve a decent speedup.

For convenience, denote the first DNN 110 and the second DNN 120 as a VMP and a VAP, respectively. To reduce the size of the two DNNs 110, 120, $\hat{V}$ and $\hat{\theta}$ are predicted by the VMP 110 and the VAP 120, respectively, to improve the training efficiency. Hence, the inputs of the VMP 110 and of the VAP 120 are ($P_d,Q_d$), while the outputs of the VMP 110 and of the VAP 120 are $\hat{V}$ and $\hat{\theta}$, respectively. (A lower bound for the approximation errors of the load-to-solution mapping for AC-OPF can be found in [6].) The loss functions of the VMP 110 (denoted as $L_V$) and of the VAP 120 (denoted as $\mathcal{L}_\theta$) are formulated as $$\mathcal{L}_v = \sum_{i\in\mathcal{N}} \|\hat{V}_i - V_i\|_2^2, \quad \mathcal{L}_\theta = \sum_{i\in\mathcal{N}} \|\hat{\theta}_i - \theta_i\|_2^2 \qquad (9)$$

where: $\hat{V}_i$ and $\hat{\theta}_i$ are predicted voltage magnitude and angle for bus i during the training, respectively; $V_i$ and $\theta_i$ are the ground truths of $\hat{V}_i$ and $\hat{\theta}_i$, respectively, which can be obtained by OPF solvers such as MIPS when preparing the training data.

For large power systems, one can split all buses into several groups and predict voltages for each group of buses in parallel. In this way, the DNN model size can be reduced greatly, and the training time would not increase significantly.

B.2. Post-Processing Method

The feasibility of the solution predicted by DeepOPF-V 100 is examined if the solution violates any one of the inequality constraints. In general, not all solutions are feasible.

A PP method is developed herein to improve the feasibility of the predicted solution. The PP method has two steps. First, the inequality constraints in (4)-(8) are checked. Second, if there is violation, the related voltage magnitudes and angles are adjusted as $$\hat{V}_{PP} = \hat{V} + \Delta V, \quad \theta_{PP} = \hat{\theta} + \Delta\theta \tag{10}$$

where $\Delta V$ and $\Delta\theta$ are obtained as follows. Denote inequality constraints in (4)-(8) in a compact form as $\underline{f} \leq f(\theta V) \leq \bar{f}$. For each inequality constraint $f_i(\theta V)$, define $\Delta f_i = \max(f_i(\theta,V) - \bar{f}_i, 0) + \min(f_i(\theta V) - \underline{f}_i, 0)$. Linearizing $\Delta f$ around the operating point $(\hat{V}, \hat{\theta})$ gives $$\begin{bmatrix} \Delta\theta \\ \Delta V \end{bmatrix} = F^+_{\theta V} \Delta f, \quad F_{\theta V} = \begin{bmatrix} \frac{\partial f}{\partial \theta} & \frac{\partial f}{\partial V} \end{bmatrix}, \tag{11}$$

where $F_{\theta V}^+$ is the pseudo-inverse of $F_{\theta V}$. Since voltages do not change a lot in normal operations, $F_{\theta V}$ may be approximated by a constant $F_{\theta V}^{his}$ calculated at average historical operating point $(V^{his}, \theta^{his})$ to reduce the computational burden, viz., $$F_{\theta V} \approx F_{\theta V}^{his} \tag{12}$$

Using (11), the values of $\Delta\theta$ and $\Delta V$ are adjusted adaptively according to $\Delta f$. Note that this method helps improve but cannot guarantee the satisfaction of inequality constraints. To guarantee voltage constraints to be satisfied, $\hat{V}_{PP}$ are kept within the limits after adjustment.

Conventionally, post-processing the predicted solution to improve feasibility usually involves a computationally intensive algorithm. For example, solving a $l_1$-projection problem with linear constraints is used in [5]. A main advantage of the PP method as disclosed herein is that this method is fast due to using linear adjustment as set forth in (10) and (11).

B.3. Load Satisfaction

Due to the prediction errors of voltages, there could be unsatisfied loads. For example, there may be mismatches between the obtained net injections and the given loads for the bus with only loads. We note that the unsatisfied loads are also inevitable in conventional approaches [11], and 1% load-generation imbalance is considered acceptable [12]. To fully satisfy loads, controllable distributed energy sources can be applied, e.g., compensating the over/under-satisfied loads by charging/discharging batteries installed at the sub station.

C. Numerical Experiments

Simulations using IEEE 118/300-bus systems and a 2000-bus test system were conducted to verify the effectiveness of DeepOPF-V. As will be shown later, when compared with existing works, DeepOPF-V achieves decent computation speedup up to four orders of magnitude and comparable performance in optimality gap and preserving the feasibility of the solution. The obtained results demonstrate that DeepOPF-V has an outstanding performance in terms of speedup and feasibility of the solution.

C.1. Experimental Setup

Simulations were conducted on modified IEEE 118/300-bus systems and a 2000-bus test system. The dataset that was used contained 40,000 samples for the 118-bus system and 60,000 samples for the 300/2000-bus systems with an 80-20% training-test split. Each sample was generated as follows. First, a load scenario was sampled randomly for each load bus from a uniform distribution of 10% variation around the default load. Then, the loads were fed into the conventional solver MIPS to obtain the optimal solutions as the ground truth values. By learning the mapping embedded in the training dataset, it was found that DeepOPF-V could provide solutions close to those given by the solver. To verify the effectiveness of DeepOPF-V in handling systems with large correlated load variations, real-time load data of IEEE 300-bus system as publicly available were used. The load data had load variations up to 42.3%.

The DNN-based model used in DeepOPF-V was designed on the platform of PyTorch, which consisted of fully-connected neural networks with 512, 256, 128-unit/1024, 768, 512, 256-unit/768, 768, 768-unit hidden layers for the 118/300/2000-bus systems. The ReLU activation function was used on the hidden layers. The Adam optimizer for training was used. The maximum epoch and learning rate were set to 1000 and 0.001, respectively. The mini-batch size was set to 50/100/512 for the 118/300/2000-bus systems. For the 2000-bus system, to reduce the DNN model size, all buses were split into 10 groups evenly and voltages for each group of buses were predicted in parallel. The DNNs were trained on a single GPU, which takes 286s/1676s/692s for the 118/300/2000-bus systems. Simulation tests were run on the quad-core (i7-3770@3.40G Hz) CPU workstation with 16 GB random access memory. The codes and data are available online.

The performance of DeepOPF-V is evaluated by the following metrics.

1) Speedup: The speedup factor $\eta_{sp}$ measures the average ratio of the computation time $t_{mips}$ consumed by MIPS to solve the original AC-OPF problem to the computation time $t_{dnn}$ consumed by DeepOPF-V.

2) Optimality Loss: It measures the average relative deviation $\eta_{opt}$ between the optimal objective value found by MIPS and that by DeepOPF-V.

3) Constraint Satisfaction: It evaluates the feasibility of the generated solutions from two aspects: constraint satisfaction ratio (i.e. the percentage of inequality constraints satisfied) and the degree of violation (i.e. the distance between the violated variable and the boundary). The constraint satisfaction ratios (the degrees of violation) of voltage magnitude, active generation, reactive generation, branch power flow and phase angle difference are denoted by $\eta_V$ ($\Delta_V$), $\eta_{P_g}$, $\eta_{Q_g}$ ($\Delta_{Q_g}$), $\eta_{S_l}$ ($\Delta_{S_l}$), and $\eta_{\theta_l}$ ($\Delta_{\theta_l}$), respectively.

4) Load Satisfaction Ratio: It is defined as the percentage of demanded loads satisfied. The active and reactive load satisfaction ratios are denoted as $\eta_{P_d}$ and $\eta_{Q_d}$, respectively.

C.2. Simulation Results Obtained for 300/2000-Bus Systems

TABLE I

Simulation results obtained for the 300-bus and 2000-bus systems.

| | IEEE 300-bus system | | 2000-bus system | |
|---|---|---|---|---|
| Metric | Before PP | After PP | Before PP | After PP |
| $\eta_{opt}$ (%) | 0.11 | 0.11 | 0.15 | 0.14 |
| $\eta_V$ (%) | 100.0 | 100.0 | 100.0 | 100.0 |
| $\eta_{P_g}$ (%) | 99.9 | 100.0 | 100.0 | 100.0 |

TABLE I-continued

Simulation results obtained for the 300-bus and 2000-bus systems.

| | IEEE 300-bus system | | 2000-bus system | |
|---|---|---|---|---|
| Metric | Before PP | After PP | Before PP | After PP |
| $\Delta P_g$ (p.u.) | 0.0020 | 0.0020 | 0 | 0 |
| $\eta_{Q_g}$ (%) | 99.3 | 99.8 | 100.0 | 100.0 |
| $\Delta Q_g$ (p.u.) | 0.3350 | 0.3350 | 0 | 0 |
| $\eta_{S_l}$ (%) | 100.0 | 100.0 | 99.71 | 99.71 |
| $\Delta S_l$ (p.u.) | 0 | 0 | 0.0247 | 0.0247 |
| $\eta_{\theta_l}$ (%) | 100.0 | 100.0 | 100.0 | 100.0 |
| $\eta_{P_d}$ (%) | 99.6 | 99.6 | 99.83 | 99.84 |
| $\eta_{Q_d}$ (%) | 99.5 | 99.4 | 99.53 | 99.53 |
| $t_{mips}$ (ms) | 3213.3 | 3213.3 | 39107.8 | 39107.8 |
| $t_{dnn}$ (ms) | 1.7 | 2.1 | 2.7 | 2.9 |
| $\eta_{sp}$ | ×1890 | ×1530 | ×16543 | ×15374 |

The results in Table I indicate that DeepOPF-V can speed up finding a solution to the AC-OPF problem significantly (i.e. up to three/four orders of magnitude in the 300/2000-bus systems) with negligible optimality loss (i.e. less than 0.15%). Besides, almost all loads are satisfied. As for the feasibility of the solution, voltage and phase angle constraints are all satisfied. For the 300-bus system, the active generation and branch flow constraints are all satisfied after PP. Almost all reactive generation constraints are satisfied with negligible violation degrees that only account for 0.03% of capacities of the largest generators installed in the 300-bus system. For the 2000-bus system, the generation constraints are all satisfied. Since most branch flow constraints are already binding in the dataset, they are slightly violated due to the prediction errors, within 1% MVA rating of the branch on average.

TABLE II

Simulation results for the modified 300-bus system with real-time load data.

| | | After PP | |
|---|---|---|---|
| Metric | Before PP | $F_{\theta V}^{his}$ | $F_{\theta V}$ |
| $\eta_{opt}$ (%) | −0.01 | −0.01 | −0.01 |
| $\eta_V$ (%) | 100.0 | 100.0 | 100.0 |
| $\eta_{P_g}$ (%) | 99.6 | 100.0 | 100.0 |
| $\Delta P_g$ (p.u.) | 0.0007 | 0 | 0 |
| $\eta_{Q_g}$ (%) | 99.8 | 100.0 | 100.0 |
| $\Delta Q_g$ (p.u.) | 0.0019 | 0 | 0 |
| $\eta_{S_l}$ (%) | 100.0 | 100.0 | 100.0 |
| $\eta_{\theta_l}$ (%) | 100.0 | 100.0 | 100.0 |
| $\eta_{P_d}$ (%) | 99.90 | 99.95 | 99.95 |
| $\eta_{Q_d}$ (%) | 99.90 | 99.94 | 99.94 |
| $\eta_{sp}$ | ×1887 | ×1562 | ×647 |

Table II shows that DeepOPF-V achieves high efficiency when load variations are significant (up to 42.3%) and correlated. Besides, the performances of using $F_{\theta V}$ and the approximated matrix $F_{\theta V}^{his}$ for the PP are compared. As seen in Table II, these two methods have the same performance except for the computational speedup. One of the main reasons is that DeepOPF-V has high prediction accuracy (i.e. the mean square prediction errors of voltage magnitudes and angles are 9.03e-5 p.u. and 2.79e-4 p.u., respectively). Thus, DeepOPF-V still achieves good performance without PP.

B.2.2. Comparison with State-of-the-Art Approaches

DeepOPF-V is also compared with the state-of-the-art approaches in [6] (denoted as DACOPF) and [8] (denoted as EACOPF). Parameters of DACOPF and EACOPF are set according to [6] and [8], respectively. For fair comparison, the training/testing samples are all set to 32,000/8,000. These approaches are not compared in larger systems due to the need for lengthy training time in obtaining the solutions of [6] and [8].

TABLE III

Comparison results in modified 118-bus system.

| Metric | DeepOPF-V | DACOPF | EACOPF |
|---|---|---|---|
| $\eta_{opt}$ (%) | 0.1 | 0.5 | 0.4 |
| $\eta_V$ (%)/$\Delta_V$ (p.u.) | 100.0/0 | 98.6/0.0074 | 99.2/0.0043 |
| $\eta_{P_g}$ (%)/$\Delta P_g$ (p.u.) | 100.0/0 | 100.0/0 | 99.3/0.0155 |
| $\eta_{Q_g}$ (%) | 100.0 | 100.0 | 100.0 |
| $\eta_{S_l}$ (%) | 100.0 | 100.0 | 100.0 |
| $\eta_{\theta_l}$ (%) | 100.0 | 100.0 | 100.0 |
| $\eta_{P_d}$ (%) | 99.8 | 100.0 | 100.0 |
| $\eta_{Q_d}$ (%) | 99.6 | 100.0 | 100.0 |
| $\eta_{sp}$ | around ×1000 | around ×10 | around ×10 |

As shown in Table III, all approaches have small optimality losses. However, DeepOPF-V has a much larger speedup (around three orders of magnitude) than the other approaches (around one order of magnitude). As for the feasibility of the solution, there is no violation of inequality constraints in DeepOPF-V, while there are voltage magnitude constraints violated in DACOPF and voltage and active generation constraints violated in EACOPF. It is because DeepOPF-V obtains voltages directly and thus can keep them within limits, while DACOPF and EACOPF obtain voltages by solving power flow equations using predicted generation set points and therefore cannot ensure voltage constraints to be satisfied. Moreover, there may be no feasible power flow solutions in DACOPF and EACOPF. This shortcoming is not a concern in DeepOPF-V because power flow equations are satisfied automatically.

All loads can be fully satisfied in DACOPF and EACOPF so long as there are power flow solutions. However, there is no guarantee of the existence of power flow solutions. In this test system, 0.15% of the testing samples have no power flow solutions in EACOPF. In contrast, DeepOPF-V always guarantees to obtain power flow solutions, with a load satisfaction ratio of 99.6%, which is practically acceptable.

D. Disclosed Method

The disclosed computer-implemented method for determining an operating condition of an AC electrical power system is developed as follows according to DeepOPF-V 100 as disclosed above. The AC electrical power system can be operated under the determined operating condition.

The system is modeled by an undirected graph with a plurality of buses and a plurality of transmission lines where the plurality of transmission lines interconnects the plurality of buses. In addition, the system is subject to a plurality of equality constraints corresponding to power flow balance equations in operating the system, e.g., (2)-(3). The system is further subject to a plurality of inequality constraints corresponding to operation limits of the plurality of buses and the plurality of transmission lines, e.g., (4)-(8). The plurality of buses is assigned with a plurality of active loads ($P_d$) and a plurality of reactive loads ($Q_d$) such that an individual bus is arranged to satisfy a respective active load and a respective reactive load.

Figure 2:
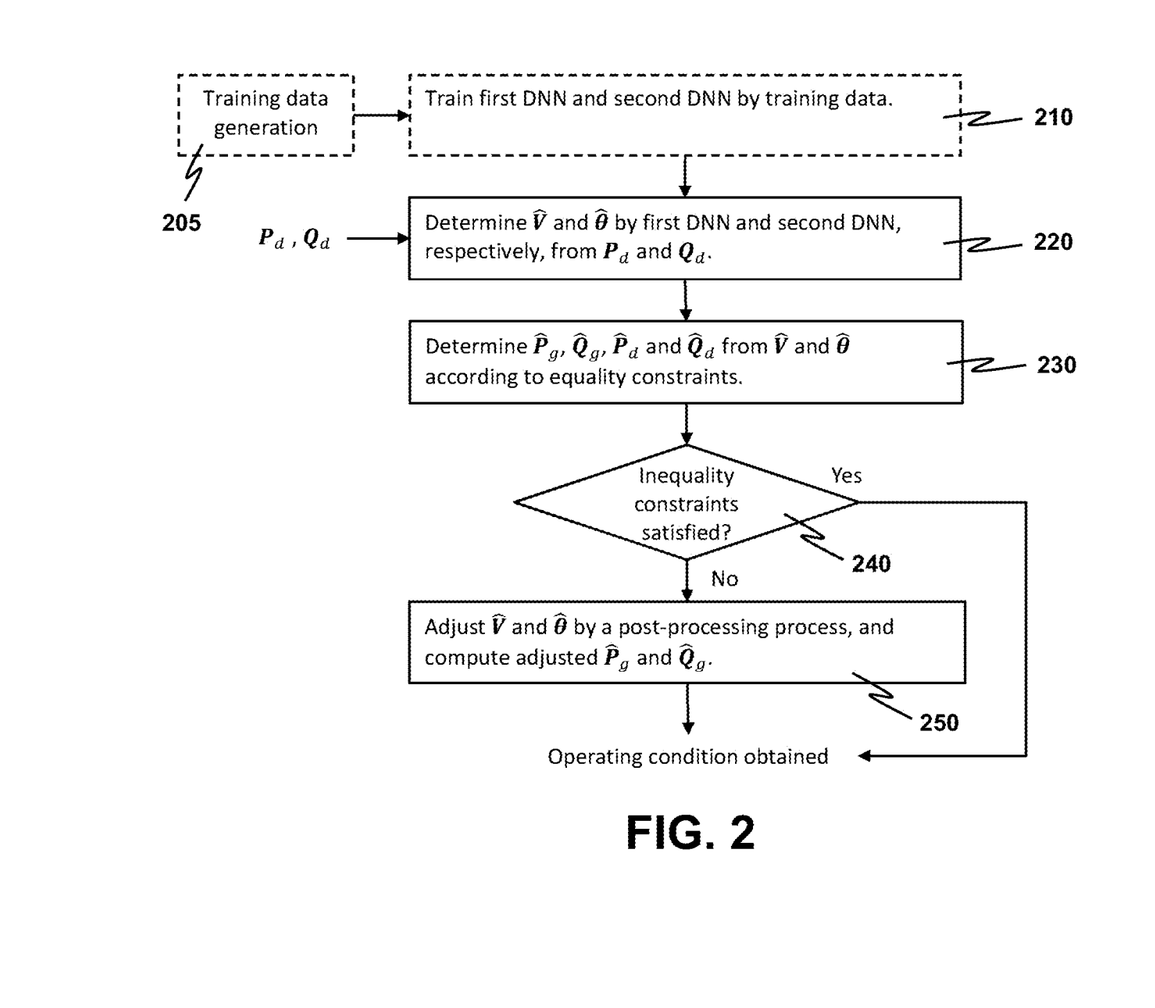
FIG. 2 depicts a flowchart showing exemplary steps of a computer-implemented method as disclosed herein for determining an operating condition of an AC electrical power system, where the disclosed method is developed based on DeepOPF-V in determining the operating condition.

The method is illustrated with the aid of FIG. 2, which depicts a flowchart showing exemplary steps of the disclosed method.

In a step 220, it is intended to predict complex-valued voltages at respective buses in the plurality of buses. Specifically, a plurality of voltage magnitudes ($\hat{V}$) and a plurality of voltage phase angles ($\hat{\theta}$) of the plurality of buses are determined from $P_d$ and $Q_d$ such that a complex-valued voltage observed at the individual bus is predicted from the determined $\hat{V}$ and and $\hat{\theta}$. Same as the setting of DeepOPF-V 100 as elaborated in Section B.1 above, $\hat{V}$ and $\hat{\theta}$ are separately computed from a first DNN and a second DNN, respectively, after the first and second DNNs are trained. Each of the first and second DNNs receives $\hat{V}$ and $\hat{\theta}$ as inputs. The first and second DNNs are organized such that there is no cross-over operation between the first and second DNNs in computing $\hat{V}$ and $\hat{\theta}$. As an advantageous result, a computation complexity of the first and second DNNs is reduced in comparison to using a single DNN to compute both $P_d$ and $Q_d$.

After $\hat{V}$ and $\hat{\theta}$ are computed in the step 220, computation of a required active generation ($\hat{P}_{gi}$) and a required reactive generation ($\hat{Q}_{gi}$) for the individual bus is carried out in a step 230. A satisfied active load ($\hat{P}_{di}$) and a satisfied reactive load ($\hat{Q}_{di}$) for the individual bus may also be computed in the step 230. The computation in the step 230 follows the procedure of obtaining $\hat{P}_{gi}$, $\hat{Q}_{gi}$, $\hat{P}_{di}$ and $\hat{Q}_{di}$ for bus i as set forth in Section B.1 above. As a result, a plurality of required active generations ($\hat{P}_g$) and a plurality of required reactive generations ($\hat{Q}_g$) for the plurality of buses are obtained. A plurality of satisfied active load ($\hat{P}_d$) and a plurality of satisfied reactive load ($\hat{Q}_d$) for the plurality of buses may also be obtained.

In a step 240, $\hat{P}_g$ and $\hat{Q}_g$ as obtained in the step 230 is checked against the plurality of inequality constraints, and whether or not the plurality of inequality constraints is satisfied by $\hat{P}_g$ and $\hat{Q}_g$ is determined. If it is found that the plurality of inequality constraints is satisfied by $\hat{P}_g$ and $\hat{Q}_g$, then $\hat{P}_g$ and $\hat{Q}_g$ as determined in the step 230 are used as the determined operating condition. If it is found that the plurality of inequality constraints is not satisfied by $\hat{P}_g$ and $\hat{Q}_g$, then $\hat{P}_g$ and $\hat{Q}_g$ are required to be adjusted and the adjusted $\hat{P}_g$ and $\hat{Q}_g$ are used as the determined operating condition.

Preferably, the PP method as disclosed above for DeepOPF-V 100 in Section B.2 is used for computing the adjusted $\hat{P}_g$ and $\hat{Q}_g$. Other methods for computing the adjusted $\hat{P}_g$ and $\hat{Q}_g$ to satisfy the plurality of inequality constraints include, for example, solving a $l_1$- projection problem with linear constraints as used in [5].

The PP method disclosed in Section B.2 is adopted in a step 250 for adjusting $\hat{P}_g$ and $\hat{Q}_g$ determined in the step 230. In the step 250, specifically, the adjusted $\hat{P}_g$ and the adjusted $\hat{Q}_g$ are obtained from $\hat{P}_g$ and $\hat{Q}_g$ by executing a PP process. In the PP process, $\hat{V}$ and $\hat{\theta}$ as determined in the step 220 are first adjusted by linear adjustment according to (10) and (11) to form an adjusted plurality of voltage magnitudes ($\hat{V}_{PP}$) and an adjusted plurality of voltage phase angles ($\hat{\theta}_{PP}$), and then the adjusted $\hat{P}_g$ and the adjusted $\hat{Q}_g$ are computed from $\hat{V}_{PP}$ and $\hat{\theta}_{PP}$ according to the plurality of equality constraints. In certain embodiments, $F_{\theta V}$ in (11) is substituted by a constant $F_{\theta V}^{his}$ calculated at an average historical operating point ($\hat{V}^{his}, \hat{\theta}^{his}$) for reducing computational burden.

It is possible that execution of the disclosed method is repeated for different settings of ($P_d$, $Q_d$) under the same AC electrical power system. For instance, different demands on electrical power may arise at different hours of a day. It follows that the first and second DNNs may be trained only once for processing the different settings of ($P_d$, $Q_d$).

In an optional step 210, the first and second DNNs are trained with training data before using the first and second DNNs in the step 220 to compute $\hat{V}$ and $\hat{\theta}$.

In certain embodiments, the training data are obtained, generated or updated before execution of the step 210. In an optional step 205, a plurality of AC-OPF solutions for a plurality of reference AC electrical power systems is obtained. The obtained plurality of AC-OPF solutions may be used as the training data in the step 210, or may be incorporated into existing training data to form expanded training data for subsequent use in the step 210.

In certain embodiments of the step 205, the plurality of AC-OPF solutions is generated. In particular, an individual AC-OPF solution for a respective reference AC electrical power system is generated by using an OPF solver to solve an AC-OPF problem formulated for the respective reference AC electrical power system.

In certain embodiments, the OPF solver is MIPS.

The present invention may be embodied in other specific forms without departing from the spirit or essential characteristics thereof. The present invention is therefore to be considered in all respects as illustrative and not restrictive. The scope of the invention is indicated by the appended claims rather than by the foregoing description, and all changes that come within the meaning and range of equivalency of the claims are therefore intended to be embraced therein.

REFERENCES

The following references are cited in the specification. Disclosures of these references are incorporated herein by reference in their entirety.

[1] W. DONG, Z. XIE, G. KESTOR and D. LI, "SmartPGsim: using neural network to accelerate AC-OPF power grid simulation," *arXiv preprint, arXiv:* 2008.11827, 2020.

[2] Y. CHEN and B. ZHANG, "Learning to solve network flow problems via neural decoding," *arXiv preprint arXiv:* 2002.04091, 2020.

[3] F. HASAN, A. KARGARIAN and J. MOHAMMADI, "Hybrid learning aided inactive constraints filtering algorithm to enhance AC OPF solution time," *Trans. Ind. Applicat.*, 2021.

[4] X. PAN, T. ZHAO and M. CHEN, "DeepOPF: Deep neural network for DC optimal power flow," in *IEEE SmartGridComm*, 2019.

[5] X. PAN, T. ZHAO, M. CHEN and S. ZHANG, "DeepOPF: A deep neural network approach for security-constrained DC optimal power flow," *IEEE Trans. Power Syst.*, 2020.

[6] X. PAN, M. CHEN, T. ZHAO and S. H. LOW, "DeepOPF: A feasibility optimized deep neural network approach for AC optimal power flow problems," *arXiv preprint arXiv:* 2007.01002, 2020.

[7] A. S. ZAMZAM and K. BAKER, "Learning optimal solutions for extremely fast AC optimal power flow," in *IEEE SmartGridComm*, 2020.

[8] K. BAKER, "Emulating AC OPF solvers for obtaining sub-second feasible, near-optimal solutions," *arXiv preprint arXiv:* 2012.10031, 2020.

[9] M. CHATZOS, F. FIORETTO, T. W. MAK and P. VAN HENTENRYCK, "High-fidelity machine learning approximations of large-scale optimal power flow," *arXiv preprint arXiv:* 2006.16356, 2020.

[10] S. FRANK and S. REBENNACK (2016), "An introduction to optimal power flow: Theory, formulation, and examples," *IIE Transactions*, 48:12, 1172-1197, DOI: 10.1080/0740817X.2016.1189626.

What is claimed is:

1. A method for operating an alternating-current (AC) electrical power system modeled with a plurality of transmission lines interconnecting a plurality of buses, the system being subject to a plurality of equality constraints corresponding to power flow balance equations in operating the system and subject to a plurality of inequality constraints corresponding to operation limits of the plurality of buses and the plurality of transmission lines, the plurality of buses being assigned with a plurality of active loads and a plurality of reactive loads such that an individual bus is arranged to satisfy a respective active load and a respective reactive load, the method comprising:
   executing a computer-implemented process of determining an operating condition of the system; and
   operating the system under the determined operating condition;
   wherein the computer implemented process comprises:
      determining a plurality of voltage magnitudes and a plurality of voltage phase angles of the plurality of buses such that a complex-valued voltage observed at the individual bus is predicted, wherein the plurality of voltage magnitudes and the plurality of voltage phase angles are separately computed by a first deep neural network (DNN) and a second DNN, respectively, without any cross-over operation between the first and second DNNs for reducing a computation complexity of the first and second DNNs in comparison to using a single DNN to compute both the plurality of voltage magnitudes and the plurality of voltage phase angles, and wherein each of the first and second DNNs receives the plurality of active loads and the plurality of reactive loads as inputs;
      computing a required active generation and a required reactive generation according to the plurality of equality constraints, the plurality of voltage magnitudes and the plurality of voltage phase angles, whereby a plurality of required active generations and a plurality of required reactive generations for the plurality of buses are obtained; and
      if the plurality of inequality constraints is satisfied by the plurality of required active generations and the plurality of required reactive generations, using the plurality of required active generations and the plurality of required reactive generations as the determined operating condition.

2. The method of claim 1, wherein the computer-implemented process further comprises:
   if the plurality of inequality constraints is not satisfied by the plurality of required active generations and the plurality of required reactive generations, using an adjusted plurality of required active generations and an adjusted plurality of required reactive generations as the determined operating condition, wherein the adjusted plurality of required active generations and the adjusted plurality of required reactive generations are obtained from executing a post-processing (PP) process;
   wherein the PP process comprises:
      computing $\Delta f = [\Delta f_1, \ldots, \Delta f_M]^T$ where M is a total number of inequality constraints in the plurality of inequality constraints, and $\Delta f_i$, $i \in \{1, \ldots, M\}$, is given by $\Delta f_i = \max(f_i(\hat{\theta}, \hat{V}) - \bar{f}_i, 0) + \min(f_i(\hat{\theta}, \hat{V}) - \underline{f}_i, 0)$ in which $\hat{V}$ is the plurality of voltage magnitudes in vector form, $\hat{\theta}$ is the plurality of voltage phase angles in vector form, $f_i$ denotes an ith inequality constraint, $f_i(\hat{\theta}, \hat{v})$ is a computed value of $f_i$ under $\hat{\theta}$ and $\hat{V}$, $\bar{f}_i$ is an upper bound specified in $f_i$, and $\underline{f}_i$ is a lower bound specified in $f_i$;
   computing $\Delta\theta$ and $\Delta V$ by $$\begin{bmatrix} \Delta\theta \\ \Delta V \end{bmatrix} = F_{\theta V}^+ \Delta f$$

where $F_{\theta V}^+$ is a pseudo-inverse of $F_{\theta V}$, and $F_{\theta V}$ is given by $$F_{\theta V} = \begin{bmatrix} \frac{\partial f}{\partial \theta} & \frac{\partial f}{\partial V} \end{bmatrix};$$

computing $\hat{V}_{PP}$ and $\hat{\theta}_{PP}$ by $\hat{V}_{PP} = \hat{V} + \Delta V$ and $\hat{\theta}_{PP} = \hat{\theta} + \Delta\theta$, respectively, where $\hat{V}_{PP}$ is an adjusted plurality of voltage magnitudes and $\hat{\theta}_{PP}$ is an adjusted plurality of voltage phase angles; and
   computing the adjusted plurality of required active generations and the adjusted plurality of required reactive generations from $\hat{V}_{PP}$ and $\hat{\theta}_{PP}$ according to the plurality of equality constraints.

3. The method of claim 2, wherein $F_{\theta V}$ is substituted by a constant $F_{\theta V}^{his}$ calculated at an average historical operating point $(V^{his}, \theta^{his})$ for reducing computational burden.

4. The method of claim 1, wherein the computer-implemented process further comprises:
   training the first and second DNNs with training data before using the first and second DNNs to compute the plurality of voltage magnitudes and the plurality of voltage phase angles.

5. The method of claim 4, wherein the computer-implemented process further comprises:
   obtaining a plurality of AC optimal power flow (AC-OPF) solutions for a plurality of reference AC electrical power systems; and
   incorporating the plurality of AC-OPF solutions into the training data.

6. The method of claim 5, wherein an individual AC-OPF solution for a respective reference AC electrical power system is generated by using an OPF solver to solve an AC-OPF problem formulated for the respective reference AC electrical power system.

7. The method of claim 6, wherein the OPF solver is Matpower Interior Point Solver (MIPS).

8. The method of claim 1, wherein the computer-implemented process further comprises:
   computing a satisfied active load and a satisfied reactive load for the individual bus according to the plurality of equality constraints, the plurality of voltage magnitudes and the plurality of voltage phase angles, whereby a plurality of satisfied active load and a plurality of satisfied reactive load for the plurality of buses are obtained.

* * * * *